United States Patent
Babinetz et al.

(10) Patent No.: US 7,651,022 B2
(45) Date of Patent: Jan. 26, 2010

(54) METHOD AND APPARATUS FOR FORMING BUMPS FOR SEMICONDUCTOR INTERCONNECTIONS USING A WIRE BONDING MACHINE

(75) Inventors: Stephen Babinetz, Lansdale, PA (US); Takashi Tsujimura, Tokyo (JP); Hiroyuki Ohtsubo, Kanagawa (JP); Yasuhiro Morimoto, Kanagawa (JP)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 280 days.

(21) Appl. No.: 11/733,868

(22) Filed: Apr. 11, 2007

(65) Prior Publication Data
US 2007/0199974 A1     Aug. 30, 2007

Related U.S. Application Data

(62) Division of application No. 10/247,242, filed on Sep. 19, 2002, now Pat. No. 7,229,906.

(51) Int. Cl.
*B23K 31/02* (2006.01)
*H01L 23/49* (2006.01)
(52) U.S. Cl. ............ 228/180.5; 257/737; 438/613
(58) Field of Classification Search ............ None
See application file for complete search history.

(56) References Cited

U.S. PATENT DOCUMENTS

| | | | |
|---|---|---|---|
| 5,014,111 A | | 5/1991 | Tsuda et al. |
| 5,090,119 A | * | 2/1992 | Tsuda et al. ............ 29/843 |
| 5,172,851 A | * | 12/1992 | Matsushita et al. ..... 228/180.22 |
| 5,299,729 A | * | 4/1994 | Matsushita et al. ..... 228/180.22 |
| 5,485,949 A | * | 1/1996 | Tomura et al. .......... 228/180.5 |
| 5,559,054 A | * | 9/1996 | Adamjee ................ 438/617 |
| 5,686,353 A | * | 11/1997 | Yagi et al. ............. 438/15 |
| 6,079,610 A | * | 6/2000 | Maeda et al. ........... 228/180.5 |
| 6,207,549 B1 | * | 3/2001 | Higashi et al. .......... 438/613 |
| 6,232,211 B1 | * | 5/2001 | Tsukahara ............. 438/612 |
| 6,244,499 B1 | * | 6/2001 | Tsai et al. ............. 228/180.5 |
| 6,260,753 B1 | * | 7/2001 | Renard et al. .......... 228/155 |
| 6,336,269 B1 | * | 1/2002 | Eldridge et al. ......... 29/885 |
| 6,622,903 B1 | * | 9/2003 | Greenwell ............. 228/110.1 |

(Continued)

FOREIGN PATENT DOCUMENTS

JP     10004096     6/1998

(Continued)

*Primary Examiner*—Kiley Stoner
(74) *Attorney, Agent, or Firm*—Christopher M. Spietzer, Sr.

(57) ABSTRACT

The present invention is a method and apparatus for forming a bump for semiconductor interconnect applications, such as reverse wire bonding or stud bumping for flip chip interconnections. The bump is formed by (1) ball bonding at the bump site, (2) raising the capillary a predetermined height after forming the ball bond with the wire paying out of the capillary tip, (3) moving the capillary laterally a predetermined distance, preferably in a direction toward the site of other end of the wire loop, if the bump is to be used as the platform for a stitch bond of a wire loop, (4) raising the capillary further, and (5) moving the capillary diagonally downwardly and in the opposite direction of the first lateral motion. The wire is then severed by raising the capillary, closing the clamps and raising the capillary again to snap the wire pigtail off at the bump.

12 Claims, 8 Drawing Sheets

U.S. PATENT DOCUMENTS

| | | | |
|---|---|---|---|
| 6,715,666 B2 * | 4/2004 | Imai et al. | 228/180.5 |
| 7,071,090 B2 * | 7/2006 | Higashi et al. | 438/617 |
| 7,225,538 B2 * | 6/2007 | Eldridge et al. | 29/879 |
| 2001/0023534 A1 | 9/2001 | Tamai et al. | |
| 2002/0117330 A1 * | 8/2002 | Eldridge et al. | 174/260 |
| 2003/0183676 A1 * | 10/2003 | Greenwell | 228/110.1 |
| 2005/0109819 A1 | 5/2005 | Qin et al. | |
| 2005/0146029 A1 * | 7/2005 | Higashi et al. | 257/737 |
| 2005/0224974 A1 * | 10/2005 | Nishida et al. | 257/737 |

FOREIGN PATENT DOCUMENTS

| | | |
|---|---|---|
| JP | 11102925 | 4/1999 |
| JP | 2000106381 A | 11/2000 |

* cited by examiner

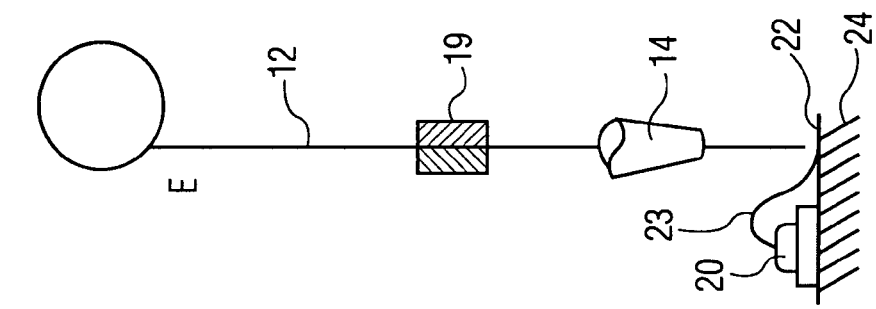
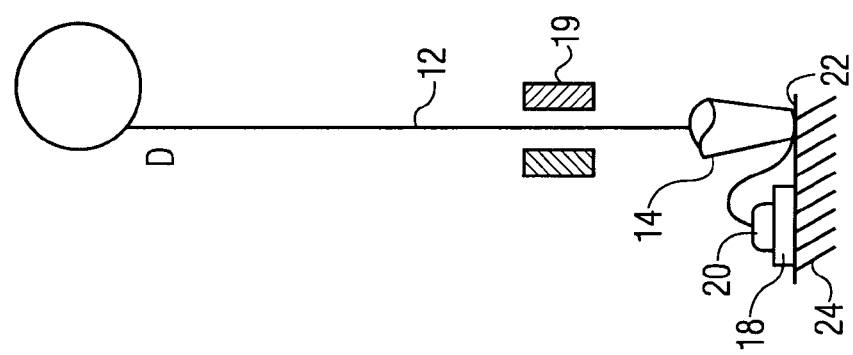
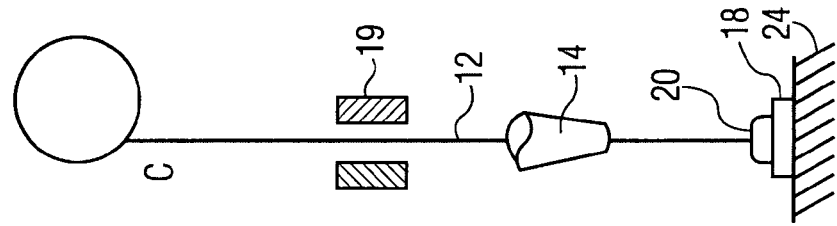
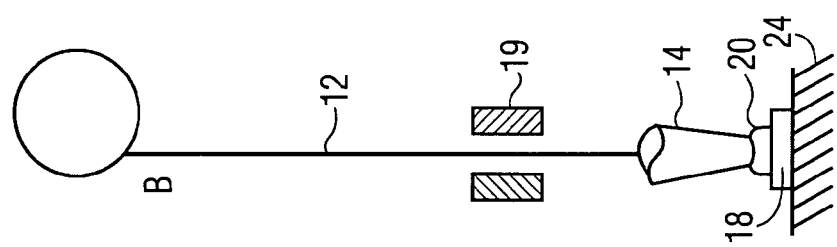
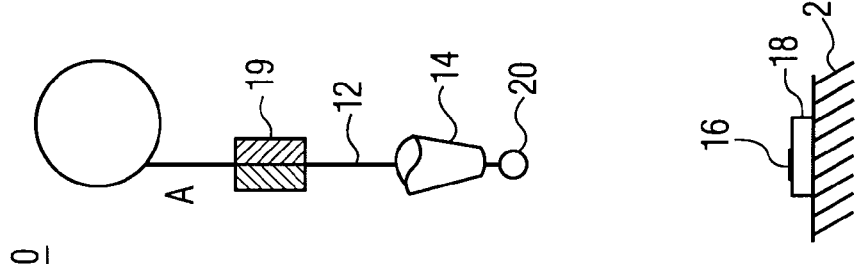

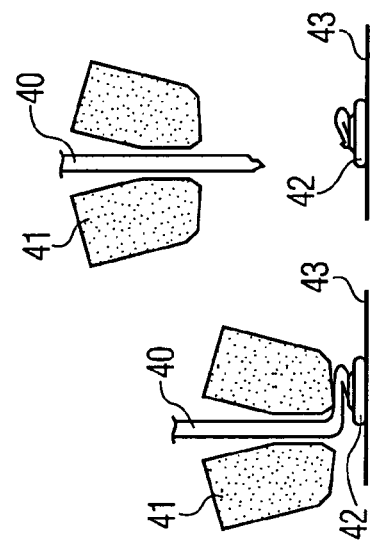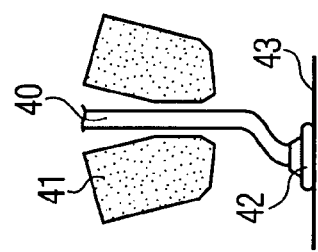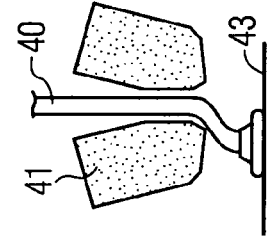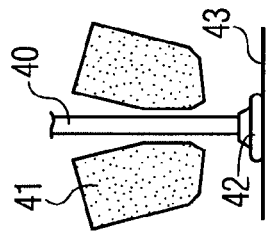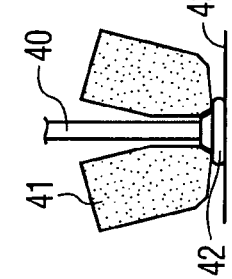

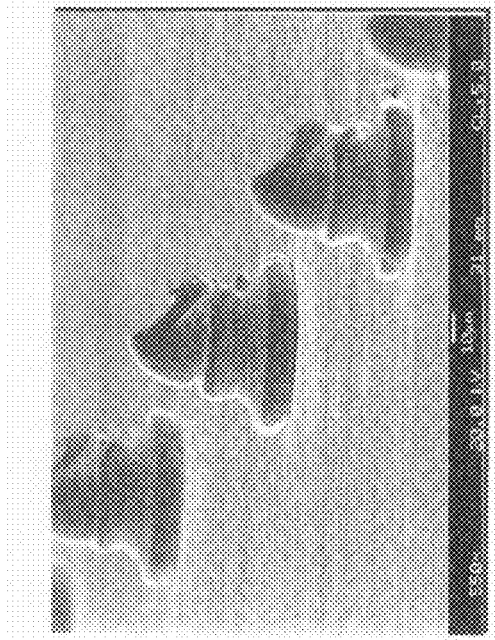
FIG. 6A
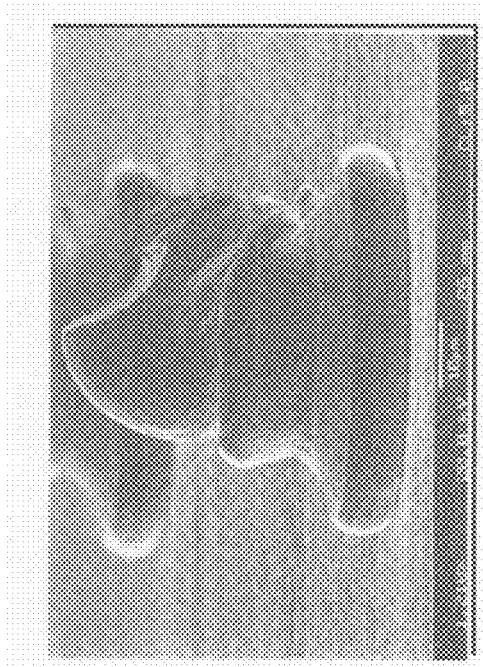
FIG. 6B
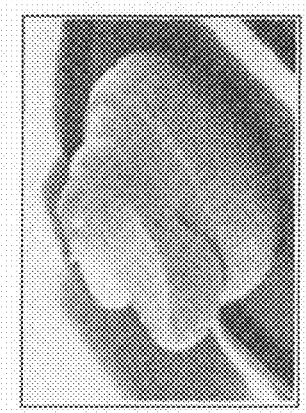
FIG. 7D
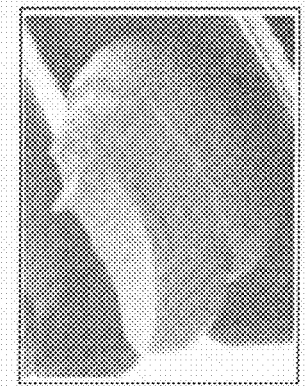
FIG. 7C
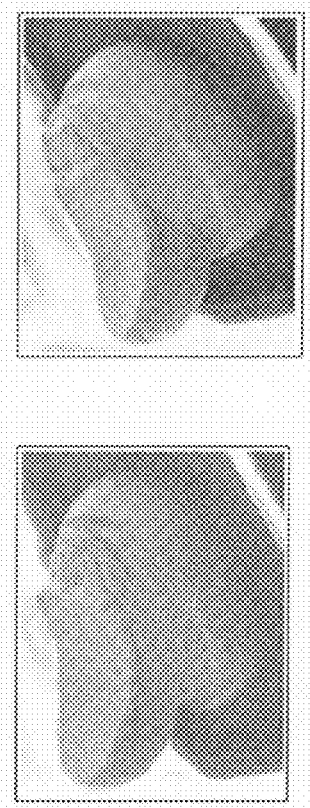
FIG. 7B
FIG. 7A

METHOD AND APPARATUS FOR FORMING BUMPS FOR SEMICONDUCTOR INTERCONNECTIONS USING A WIRE BONDING MACHINE

CROSS-REFERENCE TO RELATED APPLICATIONS

This application is a Divisional of U.S. patent application Ser. No. 10/247,242, filed Sep. 19, 2002, now U.S. Pat. 7,229,906 the disclosure of which is incorporated herein by reference.

FIELD OF THE INVENTION

The invention pertains to semiconductor electrical interconnection techniques. More particularly, the invention pertains to the formation of bumps for semiconductor interconnections using a wire bonding machine.

BACKGROUND OF THE INVENTION

There are numerous techniques in common usage for forming the electrical interconnections between the bond pads of a semiconductor die and a lead frame or other substrate. One of the oldest and still most common techniques is to form a wire bond between a die and its substrate using a wire bonding machine. The wire bonding machine forms a wire through the air between the die bond pad and the appropriate electrical connection point on the substrate (e.g., a lead finger of a lead frame).

A typical wire bond is made by "ball bonding" one end of a gold wire to a bond pad on the die and "stitch bonding" the other end of the wire to the lead frame. More particularly and referring specifically to FIG. 1A, using a ball bonding machine 10 (of which the Figures only show the capillary and the wire protruding from the capillary bore hole), a wire 12 (commonly, but not necessarily gold) is passed through the bore of a capillary 14 of the wire bonding machine 10. The capillary 14 is positioned above the bond pad 16 of the die 18 with the clamps 19 closed to prevent the wire from moving relative to the capillary. The end of the wire protruding from the capillary is heated by means of an electric spark, termed "electric flame-off", to melt the end of the wire. The end of the wire inherently forms into a ball 20 when melted. FIG. 1A shows the condition of the ball bonding apparatus at this point of the process.

With the clamps still closed so that the wire cannot pay out of the capillary or slide back within the capillary, the capillary 14 is then moved downwardly so that the ball 20 comes into contact with the bond pad 16 on the die and squeezes the ball between the tip of the capillary and the bond pad. Heat and/or ultrasonic energy are applied to the die 18 to facilitate the ball 20 becoming bonded to the bond pad 16. This bond is commonly termed a ball bond or first bond. Then the clamps 19 are opened. FIG. 1B shows the condition of the ball bonding apparatus at this point of the process. The capillary 14 is then raised above the first bond as shown in FIG. 1C.

Next, the capillary 14 is moved to a second bond site 22, this one on the substrate 24, with the wire 12 (which is still connected to the ball bond) trailing out of the capillary. The motion of the capillary between the first bond site and the second bond site may include any particular motion components desired to cause the wire to form a loop of appropriate shape between the first and second bond sites. At the second bond site 24, the capillary contacts the substrate 24 to pinch the wire 12 between the tip of the capillary 14 and the substrate 24, as shown in FIG. 1D. Again, heat and/or ultrasonic energy may be applied to facilitate bonding the compressed portion of the wire 12 to the substrate 24. This bond is commonly termed a stitch bond or second bond. At this point, the wire has been pinched, but has not been fully cut. The capillary 14 then rises with the wire 12 still attached to the stitch bond and with the clamps still open such that additional wire pays out of the capillary. The clamps 19 are then closed and the capillary 14 rises further to snap the wire at the weakened point at the stitch bond as shown in FIG. 1E. The completed interconnection, indicated by reference numeral 23 in FIG. 1E, is termed a "wire loop".

At this time, the capillary is moved to a position above the next bond pad on the die and the wire that is sticking out of the tip of the capillary after the completion of the last step is melted by electric flame-off to form the next ball for forming the next wire bond.

The ball bond is typically made on a bond pad on a semiconductor die and the stitch bond is made on the substrate, such as illustrated in FIGS. 1A-1E. Normally, it is inadvisable to make the stitch bond on the bond pad of the die because, in order to make a stitch bond, the capillary tip essentially must come in contact with the surface in and surrounding the second bond site. If the capillary contacts the top of a die, it likely will damage circuitry on the die. On the other hand, the capillary typically can come in contact with the substrate without a problem since the capillary typically will not harm the substrate.

Nevertheless, it is sometimes desirable to make a stitch bond on a die. One such situation is when, instead of connecting a bond pad of a die to a lead element, one needs to interconnect a bond pad on one die to a bond pad on another die (hereinafter die-to-die bonding). In this situation, both ends of the wire loop are on bond pads of dies. If one wishes to use a ball bonding machine to make a die-to-die wire loop, one of the dies must receive a stitch bond rather than a ball bond.

Another situation where it may be desirable to stitch bond to a bond pad of a die is when a very low-profile (i.e., thin) semiconductor die package is desired. This is because the highest point of a wire loop is close to the ball bond, as can be seen from FIG. 1E. The bond pad 16 on the top surface of the die 18 is at a higher elevation than the substrate 24 because the die 18 sits on top of the substrate. Accordingly, in low profile packaging situations, in order to minimize the height of the entire package, it is sometime desirable to make the ball bond on the lead frame and the stitch bond on the die (hereinafter reverse bonding) so that the highest point of the wire near the ball bond is at a lower elevation than in standard forward wire bonding techniques. Accordingly, the overall height of the package can be lessened. However, it usually would not be possible to form a stitch bond on a bond pad on a die for the reasons discussed above, namely, the capillary might damage surrounding circuitry on the die. when it contacts the die to form the stitch bond. Even further, as shown in FIG. 2, which is an enlarged profile of a typical wire loop 23, the wire tends to sag to its lowest point 26 close to the stitch bond site 22. If the stitch bond site is higher than the ball bond site, such as would be the case in reverse bonding, the wire might contact the edge or the top surface of the die or even other wires leading to electrical shorts or breakage of the wire.

Accordingly, techniques have been developed to ameliorate this problem. One such technique is to form a bump on top of the bond pad on the die and then form the stitch bond on top of that bump so that the capillary tip contacts the top of the bump rather than the die. The bump may be formed, for instance, using the same wire bonding machine that forms the loop. Specifically, the wire bonding machine can be used to place a ball bond on the die pad in the normal fashion, but, instead of then paying out the wire to form a wire loop and stitch bonding the wire loop at a second location, the wire is severed right at the top of the ball leaving just the ball bond on the bond pad. Specifically, the wire can be severed by (1) raising the capillary with the clamps open after forming the ball bond, (2) closing the clamps, and (3) raising the capillary further to snap the wire off at the weak point at the top of the ball. A reverse boding process can then be performed with the first/ball bond of the loop formed on the substrate and the second/stitch bond of the loop formed on top of the bump on the bond pad.

As a result of the ever-present drive toward making electronic components smaller and smaller, the diameters of the wires used in wire bonding, the size of the ball bonds and the pitch (spacing) of the bond pads on dies are all decreasing. Further, packages are becoming thinner and thinner. Accordingly, present techniques for reverse bonding are becoming less and less effective. Particularly, it is becoming increasingly difficult in reverse bonding to achieve sufficient height clearance of the wire loops to reasonably assure that the wires will not contact the top or edge of the die or adjacent wires. Also, with smaller and smaller bumps, it is becoming increasingly difficult to form reliable stitch bonds on top of the bumps. One technique that has been employed to help improve the reliability of stitch bond formation on the tops of bumps is to smooth the top of the bump during its formation. For instance, one particular technique is to (1) form a ball bond on the pad in the normal fashion by melting the wire, moving the capillary down to press the melted ball onto the bond pad and applying heat and/or ultrasonic energy, (2) raising the capillary slightly (on the order of a fraction of the thickness of the wire) so that the capillary tip is still within the ball, (3) moving the capillary laterally or diagonally downward while applying ultrasonic energy such that the capillary tip partially cuts through the gold near the top of the ball and smooths the top of the ball, (4) raising the capillary with the clamps opened so that the wire (which is still attached to the top of the ball) pays out of the capillary, (5) closing the clamps, and (6) raising the capillary further to pull the wire causing the wire to snap off at the weak point created at the top of the ball. FIG. 3 shows a bump 30 formed by this process. The bump essentially comprises a ball bond 31 with a sloped, smoothed surface 32 on top and a nub 33 where the wire was severed. Bumps formed by this process tend to have more uniform height and a large, smooth surface more amenable to reliable stitch bonding thereon. However, with very fine wires and/or fine pitch applications, it is still difficult with this technique to assure adequate clearance between the wire and the die.

A diagonal motion to smooth the top of the ball often is preferable to a strictly lateral motion. Particularly, while the purely lateral smoothing motion worked well for many applications, it was found that, as ball sizes and pitches continued to decrease in size, the force exerted by the capillary tip on the bump during the purely lateral smoothing motion could tear the bump off of the pad. In either embodiment, since a portion of the top of the bump was being scraped off, this technique often suffered even greater problems of inadequate clearance.

Formation of bumps for electrical interconnection of semiconductor devices to substrates is used in another well known technique termed flip chip bonding. In flip chip techniques, the semiconductor die is "flipped" such that its "top" surface (i.e., the surface bearing the bond pads and circuitry) faces downwardly. Bumps are formed on the substrate in positions so as to mate with bond pads on the die. The upside down die is pressed down onto the substrate so that the die is suspended upside-down on the substrate with the bond pads in electrical contact with the stud bumps on the substrate such that the remaining circuitry on the die does not contact the substrate. Various techniques for forming the stud bumps on the substrate are well known, including forming such bumps with a wire bonding machine essentially in the way described above for forming bumps for reverse wire bonding. In flip chip interconnect techniques, there is a minimum bump height necessary to assure adequate clearance between the surface of the substrate and the surface of the die to avoid electrical shorting. As wire diameters and pitches of the bond pads continue to decrease, it is becoming more and more difficult to form bumps of sufficient height and uniformity with a wire bonding machine.

Accordingly, it is an object of the present invention to provide an improved method and apparatus for forming bumps for semiconductor electrical interconnection applications.

It is another object of the present invention to provide an improved bump for semiconductor electrical interconnection applications.

It is a further object of the present invention to provide an improved method and apparatus for forming bumps for semiconductor electrical interconnection applications using a wire bonding machine.

It is a yet a further object of the present invention to provide an improved method and apparatus for performing reverse bonding using a wire bonding machine.

SUMMARY OF THE INVENTION

In accordance with the present invention, a bump for semiconductor electrical interconnection applications, such as reverse wire bonding or stud bumping for flip chip interconnections, is formed by (1) ball bonding at the bump site, (2) raising the capillary a predetermined height after forming the ball bond with the wire paying out of the capillary tip, (3) moving the capillary laterally a predetermined distance, (4) further raising the capillary, and (5) moving the capillary diagonally downwardly in the opposite lateral direction of the first lateral motion. The wire is then severed by raising the capillary, closing the clamps and raising the capillary again to snap the wire pigtail off at the bump.

Preferably the capillary is positioned for the final diagonal motion so that the tip of the capillary contacts and smooths a portion of the top of the bump. This technique can form a taller and larger bump to provide increased clearance for both flip chip applications and reverse wire bonding applications. For reverse wire bonding application, the first lateral motion preferably is in a direction toward the site of the other end of the wire loop (i.e., where the first/ball bond of the completed loop will be formed) so that the sloped, smooth surface on top of the bump where the stitch bond wilt be formed slopes upwardly toward the direction of the wire loop. This arrangement provides a sloped surface that minimizes wire sag near the stitch bond by causing the wire to have more of an upward angle at the stitch bond.

The best values for the first and second capillary rise heights, the lateral motion distance, and the distance and angle of the diagonal motion depend largely on the wire diameter and the dimensions of the capillary, which, collectively, largely define the size of the ball bond that forms part of the bump. They also will depend on the particular purpose of the bump. For instance, if the bump is to be the second bond site for a wire loop, the desired height of the sloped, smooth surface will generally be less than the desired height when the bump is used as a stud bump for flip chip interconnection. Generally, the lateral and diagonal motions will be larger if a larger or taller bump is needed since increasing these distances will increase the amount of wire that pays out of the capillary during formation of the fold on top of the bump. Also, if increasing height is more important than providing a particular surface of stitch bonding, the two rise height parameters and the lateral and diagonal motion parameters may be adjusted to provide a steeper fold on top of the bump.

In a reverse wire looping application, once the bump is formed as described above, the same or a different wire bonding machine can then form another ball bond at a second location and complete the wire loop by forming a stitch bond on top of the bump.

BRIEF DESCRIPTION OF THE DRAWINGS

FIGS. 1A through 1E are diagrams illustrating the steps of wire bonding in accordance with the prior art.

FIGS. 4A through 4F are diagrams illustrating the position of the capillary and wire at various stages of the bump formation technique in accordance with one embodiment of the present invention.

FIGS. 6A and 6B are scanning electron micrographs (SEMs) of bumps formed in accordance with one embodiment of the present invention.

FIGS. 7A through 7D are SEMs of bumps formed in accordance with another embodiment of the present invention.

DETAILED DESCRIPTION OF THE PRESENT INVENTION

Figure 2:
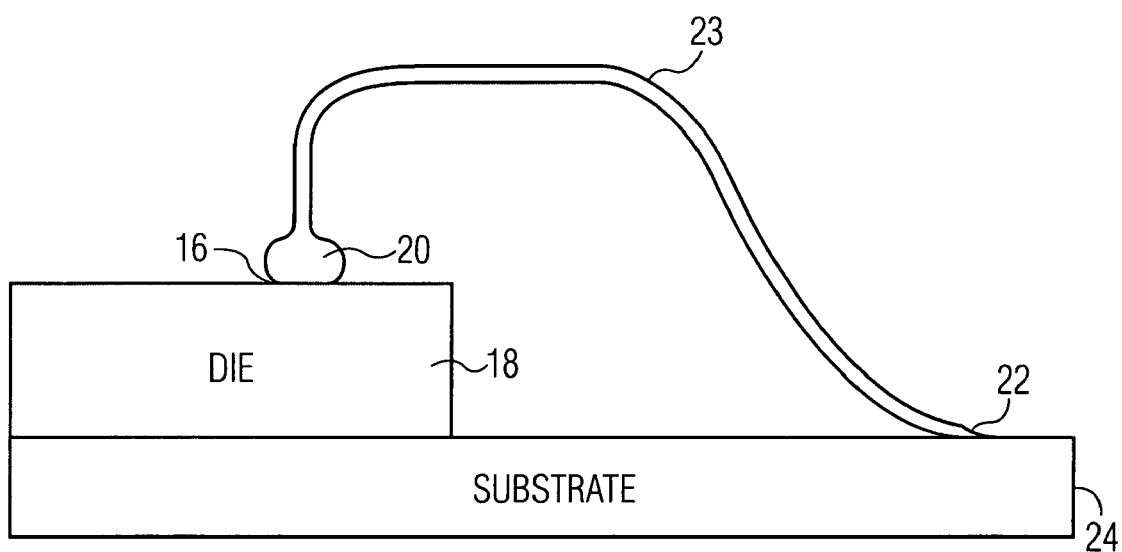
FIG. 2 is a profile of a wire loop in accordance with the prior art.
Figure 3:
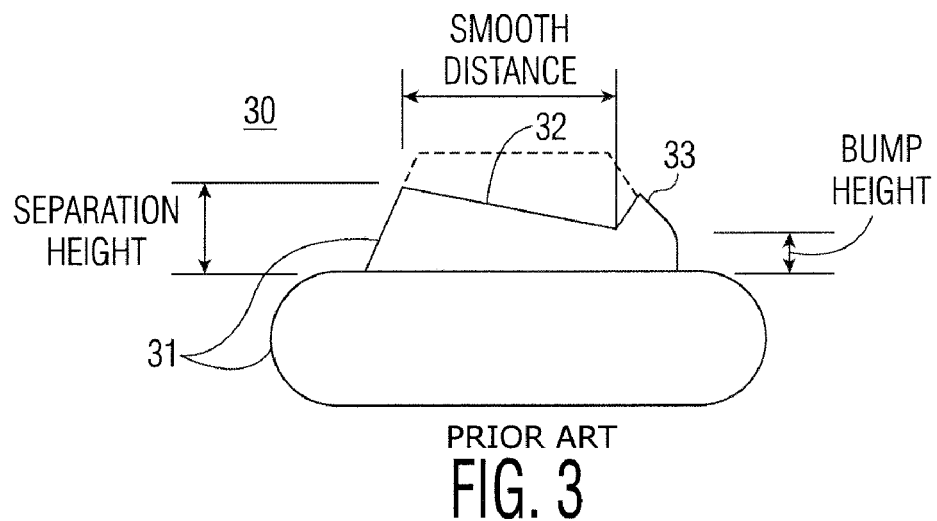
FIG. 3 is a profile of a bump formed by a wire bonding machine in accordance with one particular prior art technique.

FIGS. 4A through 4F generally illustrate the position of the capillary tip and the wire at six different stages of an exemplary bump formation process in accordance with the present invention. As shown, the beginning of the bump formation process is essentially identical to the prior art techniques. Particularly, the process starts with a short distance of the wire 40 extending from the capillary 41. The wire is hit with an electric spark to cause it to melt and inherently form into a ball 42. The capillary then drops down to contact the bond site 43 and squeeze the ball against the surface of the bond site and form the initial shape of the bump as dictated by the shape of the capillary tip. Heat and/or ultrasonic energy is applied to form the bond between the ball and the surface. FIG. 4A shows the process at this point.

Next, the capillary 41 rises with the clamps (not shown) open in order to pay out a short distance of wire extending from the top of the bonded ball 42. The distance of this rise is herein termed the separation height. FIG. 4B shows the capillary position after this step. The capillary 41 then moves laterally in a first direction (to the right in FIGS. 4A through 4F) to kink the wire as shown in FIG. 4C, thus forming two bends 40a and 40b in the wire. The distance of this lateral motion is herein termed the fold offset. The capillary then moves upward again a short distance to pay out additional wire. Generally, although not necessarily, the distance of this second vertical rise will be at least the distance of the first vertical rise plus an extra distance herein termed the fold factor. Accordingly, the distance of this second vertical rise will generally be referred to in this specification as the sum of the separation height (i.e., the first vertical rise) and the fold factor. In any special circumstances where the second vertical rise is to be less than the separation height, the fold factor is simply a negative value. The fold factor is used to control the amount of wire in the wire fold that forms the top of the bump. FIG. 4D shows the position of the capillary and wire at this point in the process. The capillary then moves diagonally downward and back to the left to fold the wire back on top of itself on top of the bump. Particularly, using standard vector analysis, the diagonal motion can be considered to comprise two orthogonal components, namely a vertical component and a lateral (that is, horizontal) component. The vertical component is a downward component ending at what is herein termed the bump height. Accordingly, the distance of the vertical component of the diagonal motion is the separation height minus the bump height. The lateral component of the diagonal motion is herein termed the fold return offset and is generally in the opposite direction of the first lateral direction, i.e., the fold offset. This causes the wire to fold over on itself. Preferably, the distances of the various motions, i.e., separation height, fold offset, fold return offset and bump height, are selected so that the capillary tip is within the wire over at least a portion of the diagonal motion such that the capillary tip scrapes off part of the wire that bends around the tip of the capillary, thus creating a smoothed, sloped surface on top of the bump. FIG. 4E show the capillary tip at the end of the diagonal motion.

Next, the capillary 41 rises with the clamps open in order to pay out a short distance of wire. The clamps are then closed and the capillary 41 rises again to snap the wire at the end of the smoothed portion of the bump. FIG. 4F shows the position of the capillary 41 and bump 42 at this point, which essentially is the end of the bump formation process.

The wire bonding machine is controlled by control circuitry that can cause the machine to perform the process described herein. Commonly the circuitry comprises a digital processing device such as a programmed general purpose computer, a digital signal processor, a state machine, a combinational logic circuit, a microprocessor, an application specific integrated circuit or any other known digital processing means. If the circuitry comprises a computer, the invention would reside largely, if not exclusively, in the software for programming the computer to control the wire bonding machine to perform the processes described herein.

Figure 5:
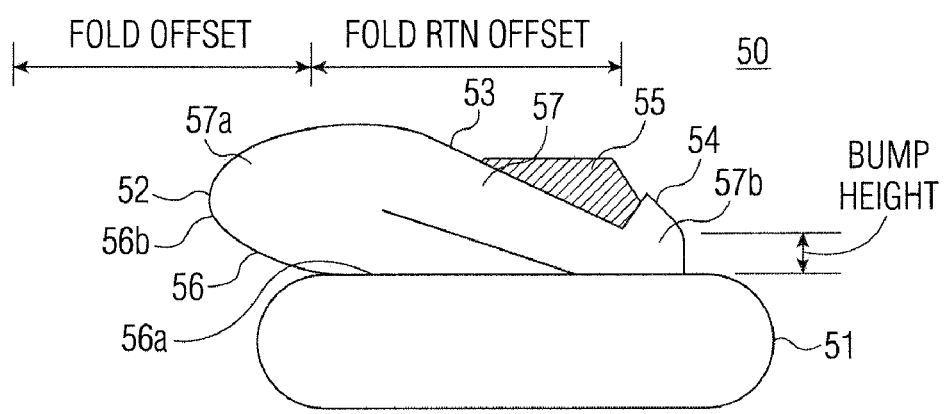
FIG. 5 is a profile of a bump formed by a wire bonding machine in accordance with an embodiment of the present invention.

Referring now to FIG. 5, which is an elevation view of an exemplary bump 50 formed in accordance with the present invention as described above in connection with FIGS. 4A through 4F, the bump comprises a bottom portion 51 generally formed during the initially steps of forming a ball bond as illustrated in FIG. 4A. On top of the bottom portion of the bump 51 is a fold of wire 52. The fold of wire 52 generally comprises a first folded portion 56 having a first end 56a extending from and integral with the top of the ball bond portion 51 of the bump and a second end 56b, a second folded portion 57 having a first end 57a that is essentially collocated with the second end 56b of the first folded portion and a second end 57b. Smoothed, sloped portion 53 on the fold was formed in the second folded portion 57 of the bump by the above-described scraping by the capillary tip during the aforementioned diagonal motion illustrated by FIGS. 4D and 4E. Nub 54 essentially is left where the wire was severed and essentially is at the second end 57a of the second folded portion. Lightly shaded portion 55 represents the volume of wire material that was scraped by the capillary tip to form the smoothed, sloped surface 53.

In an alternative embodiment of the invention, the diagonal motion can be split into two sequential motions comprising a lateral motion followed by a downward motion. This two step process still provides a smoothed, sloped surface since the outside edge of the capillary is sloped and, if it contacts the wire, it will form a smooth diagonal surface as generally shown in FIG. 5.

The particular values for separation height, bump height, fold factor, fold offset, and fold return offset to form an appropriate bump depend largely on the dimensions of the capillary tip, capillary hole diameter and capillary chamfer diameter, and the wire diameter. In general, the larger the wire diameter, the larger the fold offset and fold return offset values necessary. Normally, it is preferred to determine the best values for the aforementioned parameters on an empirical basis and based on the goals of the specific application. For instance, if the bump is to be used for flip chip interconnections, the exact shape and height of the smoothed, sloped portion may not be particularly significant. Rather, the total height of the bump is likely the most important factor. If, on the other hand, the bump if to be used as the site of the second bond in reverse wire bonding, then the shape and/or height of the smoothed, sloped surface tends to be more important than the ultimate height of the bump.

Generally, taller overall bumps, which may be more desirable for flip chip applications, can be formed by increasing one or both of (1) the slope of the wire fold on top of the bump and (2) the amount of wire that forms the fold. The slope of the sloped, smoothed surface generally can be increased by reducing the fold offset and increasing the fold return offset relative to the separation height. Further, the amount of wire in the fold is generally increased by increasing the separation height and fold factor. FIGS. 6A and 6B are scanning electron micrographs (SEMs) of bumps formed in accordance with the present invention designed with overall increased bump height as a significant concern. These bumps were made using the following exemplary parameters.

| Parameter | Value |
| --- | --- |
| Wire diameter | 1.0 mils |
| Capillary chamfer diameter | 1.8 mils |

-continued

| Parameter | Value |
| --- | --- |
| Capillary tip diameter | 3.9 mils |
| Capillary hole diameter | 1.3 mils |
| Bump height | 0.5 mils |
| Separation height | 1 mils |
| Fold offset | 1 mils |
| Fold return offset | −2 mils |
| Fold factor | 1 mils |

On the other hand, if it is more important to achieve a lesser slope and a greater area for the sloped, smoothed surface for stitch bonding, the slope of the sloped, smoothed surface generally can be decreased and the area thereof increased by increasing the fold offset and decreasing the fold return offset distances relative to the separation height. FIGS. 7A through 7D are SEMs of bumps formed in accordance with the present invention that were designed with the provision of a large smooth and stable surface for stitch bonding as a significant concern. These bumps were made using the following exemplary parameters.

| Parameter | Value | | | |
| --- | --- | --- | --- | --- |
| Wire diameter | 1.18 mils | | | |
| Capillary chamfer diameter | 2.3 mils | | | |
| Capillary tip diameter | 5.1 mils | | | |
| Capillary hole diameter | 1.6 mils | | | |
| Bump height | 0.5 mils | | | |
| Separation height | 1.2 mils | | | |
| Fold offset | 1.8 mils | | | |
| Fold return offset | −1.8 mils (FIG. 7A) | −1.5 mils (FIG. 7B) | −1.4 mils (FIG. 7C) | −1.1 mils (FIG. 7D) |
| Fold Factor | 0.75 mils | | | |

The table below shows minimum, maximum and exemplary values for the wire bonding machine control parameters (i.e., separation height, bump height, fold offset, fold return offset, and fold factor) as functions of the capillary and wire dimensions, i.e., wire diameter (WD), capillary tip diameter (TIP), capillary chamfer diameter (CD), and capillary hole diameter (HD). The minimum and maximum values define ranges that have been shown to provide appropriate results in achieving the different bump shapes necessary for reverse bonding and flip chip bumping. Values outside of these ranges may very well also produce acceptable results and these ranges are merely exemplary. Further, the column labeled "Exemplary" represent recommended starting points for experimental determination of the best values, which, as noted above, preferably should be determined empirically and depend on the particular application.

| Parameter | Minimum | Maximum | Exemplary |
| --- | --- | --- | --- |
| Bump height | 0.0 | WD | 0.5WD |
| Separation height | CD/2 | CD | HD |
| Alternate separation height | WD | 2WD | HD |
| Fold offset | WD | CD | HD |
| Fold return offset | WD | CD | (TIP − CD)/2 |
| Fold factor | 0.0 | 2WD | 0.5WD |

In general, the higher the desired bump for any given wire diameter and capillary size, the shorter the fold offset and/or the greater the separation height, fold return offset and/or fold factor. It has been observed that, if the bump is to be used as a platform for a stitch bond of a wire loop, values between the "Minimum" and "Exemplary" values in the table above are likely to be more appropriate. If, on the other hand, increased bump height is more important, as would typically be the case for flip chip bonding, then parameter values between the "Exemplary" and "Maximum" values in the table above are likely to be more appropriate.

The fact that the stitch bond made on a sloped surface helps keep the wire from sagging near the stitch bond. The fact that the stitch bond is made on a large, smooth surface improves the reliability of the stitch bond.

Figure 8:
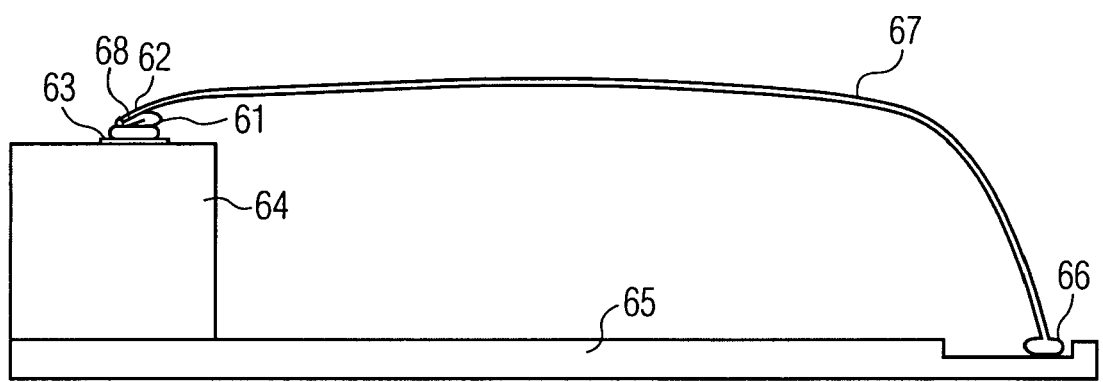
FIG. 8 is a profile of a reverse bonded wire loop bump formed by a wire bonding machine in accordance with an embodiment of the present invention.

FIG. 8 shows a wire loop in which the stitch bond is made on top of a bump made in accordance with the present invention. In this particular embodiment, the bump 61 and stitch bond 62 are made on the bond pad 63 of a die 64 that is supported on a substrate, such as a lead frame 65, on which the first/ball bond 66 of the wire loop 67 is made. As can be seen in FIG. 8, the wire loop 67 extends away from the bump and stitch bond 61, 62 in the uphill direction of the sloped, smoothed surface (to the right in FIG. 8). Thus, the wire extends away from the stitch bond at an upward angle that helps keep the wire from sagging near the stitch bond. In operation, the bump 61 is placed on the bond pad 63 in the manner described hereinabove in connection with FIGS. 4A through 4F. Next, the capillary of the same or a different wire bonder moves to the site on the substrate 65 for the first/ball bond of the wire loop and forms a ball bond 66. The capillary then moves to a position over the previously formed bump 61, which will be the location for the second/stitch bond of the wire loop. The motion of the capillary between the first bond site and the second bond site can include any motion components deemed necessary to properly shape the wire loop 67. The second/stitch bond 62 is then made on top of the sloped, smooth portion 68 of the bump 61. Particularly, the capillary moves down and contacts the sloped, smooth surface, thus pinching the wire between the capillary tip and the sloped, smooth surface. Heat and/or ultrasonic energy may be applied to facilitate bonding. The capillary then rises with the clamps open to pay out a short distance of wire. The clamps close and the capillary rises again snapping the wire at the weakened stitch bond. The resulting wire loop 67 is shown in FIG. 8.

Figure 9:
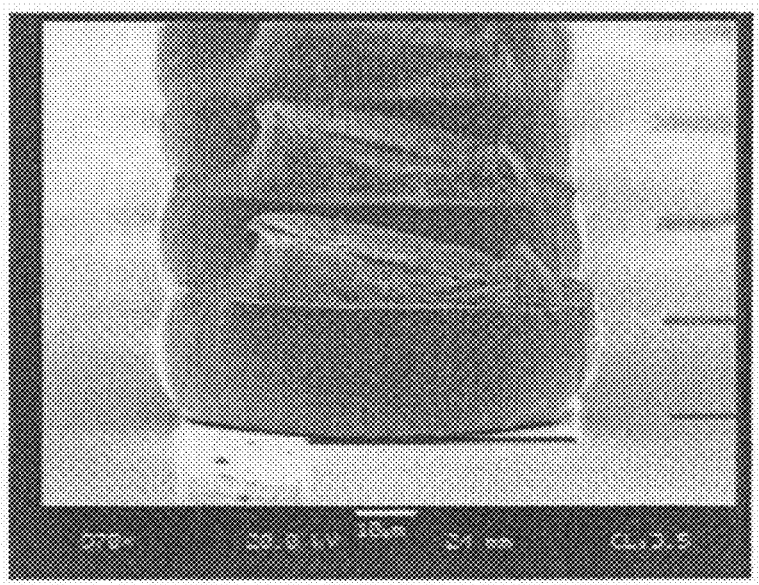
FIG. 9 is a scanning electron micrograph of a bump formed in accordance with the prior art.

FIG. 9 is a scanning electron micrograph (SEM) of a plurality of bumps made on bond pads of a semiconductor die in accordance with the prior art technique described above in the background section of this specification.

Figure 10:
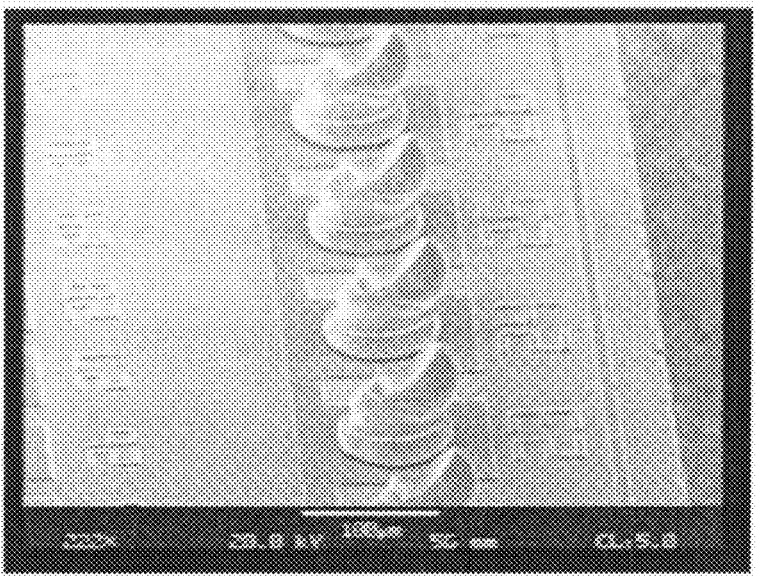
FIG. 10 is a scanning electron micrograph of a bump formed in accordance with the present invention.

FIG. 10 is a SEM of a plurality of bumps made on bond pads of a semiconductor die in accordance with the present invention. As can be seen the bumps have more gold, a greater height and a larger and more steeply sloped, smooth surface for accepting a stitch bond.

Figure 11A:
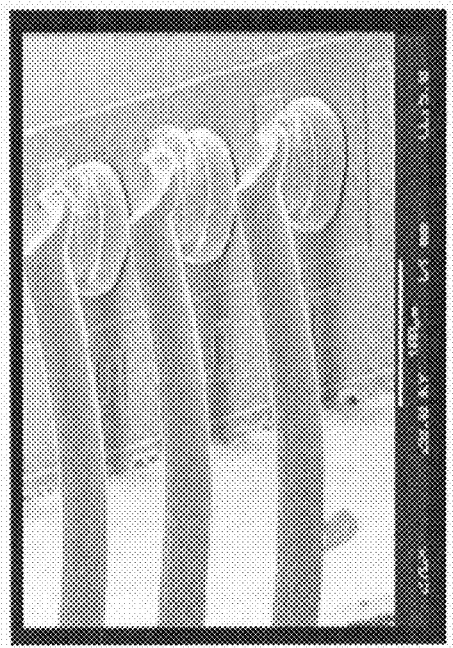
FIG. 11A is a scanning electron micrograph of the stitch bond ends of a plurality of wire bonds formed between a die and a substrate in accordance with the prior art taken from a first perspective.
Figure 11B:
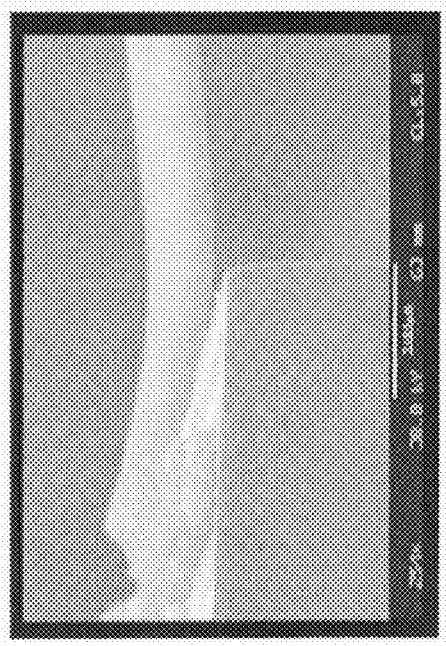
FIG. 11B is a scanning electron micrograph of the stitch bond ends of a plurality of wire bonds formed between a die and a substrate in accordance with the present invention taken from a first perspective.

FIG. 11A is a SEM showing a portion of a plurality of wire loops near the stitch bonds made on top of a bump made on bond pads of a semiconductor die in accordance with the prior art technique described above in the background section of this specification. FIG. 11B is a SEM showing the prior art bonds from FIG. 11A from a different, lower perspective. As can be seen in both FIGS. 11A and 11B, the wire loop sags substantially and almost contacts the edge of the die.

Figure 12A:
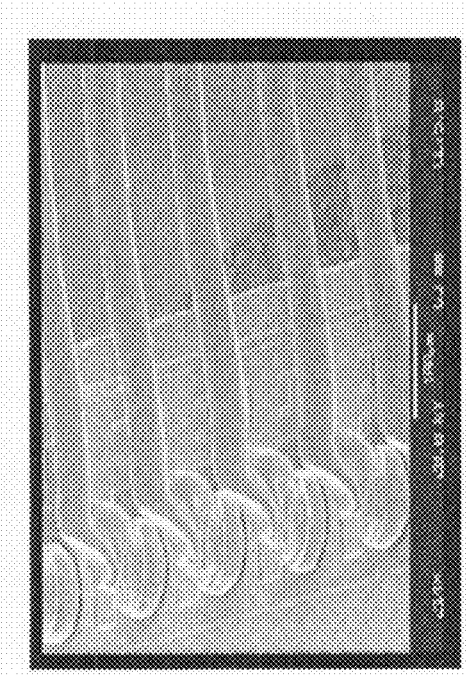
FIG. 12A is a scanning electron micrograph of the stitch bond ends of a plurality of wire bonds formed between a die and a substrate in accordance with the prior art as seen from a different perspective than seen in FIG. 8A.
Figure 12B:
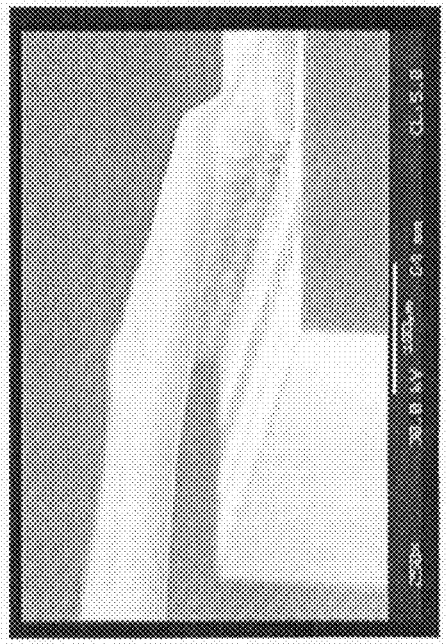
FIG. 12B is a scanning electron micrograph of the stitch bond ends of a plurality of wire bonds formed between a die and a substrate in accordance with the present invention as seen from a different perspective than seen in FIG. 8B.

FIG. 12A is a SEM showing a portion of a plurality of wire loops near the stitch bonds made on top of a bump made on bond Dads of a semiconductor die in accordance with the present invention. FIG. 12B is a SEM showing the bonds from FIG. 12A from a different, lower perspective. As can be seen, the wire loops sag substantially less than in the prior art technique illustrated by FIGS. 11A and 11B and clear the top surface and edge of the die by a substantial distance.

We have disclosed new methods and apparatus for creating bumps for semiconductor interconnection applications, such as reverse wire bonding and flip chip. Further, we have disclosed a method and apparatus for wire loop bonding, particularly, reverse wire loop bonding. Some of the advantages of the present invention include the formation of a larger and/or taller bump that helps improve substrate clearance in flip chip interconnect applications and helps improve wire loop clearance and minimize wire sag in reverse wire loop bonding applications. Bumps formed in accordance with the present invention provide a larger, more uniform and more stable, smooth surface on which a stitch bond may be formed in a reverse wire looping application. Among other things, this helps improve loop stability (including, loop shape consistency and loop height consistency).

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed:

1. A bump for semiconductor electrical interconnection comprising: a ball bond formed on a surface; and a continuous fold of wire including a length of wire on top of another length of wire, the fold of wire being formed on the top of said ball bond, the fold of wire including a smoothed portion smoothed by a capillary of a wire bonding machine during formation of the fold of wire on top of the ball bond.

2. The bump of claim 1 wherein said bump is formed with the wire bonding machine and said ball bond and said wire fold are formed of wire from said wire bonding machine.

3. The bump of claim 1 wherein the smoothed portion of said wire fold comprises a smooth, sloped top surface.

4. The bump of claim 3 wherein said wire fold comprises a first folded portion having a first end integral with and extending from a top of said ball bond in a first direction having a lateral component, said first folded portion further comprising a second end and a second folded portion extending from said second end of said first folded portion in a second direction generally opposite of said first direction.

5. The bump of claim 4 wherein said second folded portion comprises a first end extending from said second end of said first folded portion and a second end at which said wire fold was severed from said wire bonding machine.

6. The bump of claim 5 wherein said first direction and said second direction are diagonal directions, each comprising a lateral component and a vertical component.

7. The bump of claim 6 wherein said smooth, sloped surface is formed in said second folded wire portion.

8. The bump of claim 7 wherein said smooth, sloped surface is formed by scraping the second wire fold portion with the capillary of the wire bonding machine during said formation of said bump.

9. The bump of claim 8 wherein said ball bond is formed by ball bonding with said wire on said surface using the capillary of said wire bonding machine, and said wire fold is formed by (a) raising said capillary a first height above said ball bond such that wire attached to said ball bond pays out of said capillary, (b) moving said capillary laterally a first lateral distance in a first direction, (c) raising said capillary further by a second height, (d) moving said capillary in a second direction, said second direction having a downward component and a lateral component to form the fold of wire on top of the ball bond, said lateral component being generally opposite of said first direction, and (e) severing said wire from said bump.

10. The bump of claim 9 wherein said wire fold is formed by further applying at least one of heat and ultrasonic energy while moving said capillary in said second direction.

11. A wire loop for semiconductor electrical interconnection comprising: the bump of claim 1; a second ball bond formed at a location spaced from said bump; a stitch bond formed on top of said bump; and a wire loop having a first end integral with and extending from said second ball bond and a second end integral with and extending from said stitch bond.

12. The wire loop of claim 11 wherein said wire fold comprises a smooth, sloped top surface and said stitch bond is made on said smooth, sloped surface of said bump.

* * * * *